US 12,363,463 B2

(12) United States Patent
Sato et al.

(10) Patent No.: US 12,363,463 B2
(45) Date of Patent: Jul. 15, 2025

(54) PHOTOELECTRIC CONVERSION DEVICE AND METHOD OF DRIVING PHOTOELECTRIC CONVERSION DEVICE

(71) Applicant: CANON KABUSHIKI KAISHA, Tokyo (JP)

(72) Inventors: Masaki Sato, Kanagawa (JP); Koichiro Iwata, Kanagawa (JP); Yu Arishima, Kanagawa (JP); Kentaro Tsukida, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 339 days.

(21) Appl. No.: 18/173,238

(22) Filed: Feb. 23, 2023

(65) Prior Publication Data

US 2023/0276150 A1   Aug. 31, 2023

(30) Foreign Application Priority Data

Feb. 28, 2022 (JP) .................................. 2022-028880

(51) Int. Cl.
*H04N 25/78* (2023.01)
*H04N 25/704* (2023.01)
(Continued)

(52) U.S. Cl.
CPC ........... *H04N 25/78* (2023.01); *H04N 25/704* (2023.01); *H04N 25/766* (2023.01);
(Continued)

(58) Field of Classification Search
CPC .... H04N 25/78; H04N 25/704; H04N 25/766; H04N 25/778; H04N 25/44; H10F 39/182; H10F 39/802; H10F 39/8063
(Continued)

(56) References Cited

U.S. PATENT DOCUMENTS

2013/0038757 A1   2/2013   Haneda
2013/0044250 A1*  2/2013   Senda .................... H04N 25/79
                                                348/333.01
(Continued)

FOREIGN PATENT DOCUMENTS

JP   2013038597 A   2/2013
JP   2016021052 A   2/2016
JP   2021122131 A   8/2021

*Primary Examiner* — Usman A Khan
(74) *Attorney, Agent, or Firm* — Canon U.S.A., Inc. IP Division

(57) ABSTRACT

A photoelectric conversion device includes pixels each including a plurality of photoelectric conversion elements and arranged in a matrix, and a control circuit that controls the pixels on row-by-row. Each pixel may output a first signal corresponding to charge generated by the first photoelectric conversion element and a second signal corresponding to charge generated by the first and second photoelectric conversion elements. The control circuit performs a first reset operation and a first readout operation for reading out the second signal on pixels in a first row, and performs a second reset operation, a second readout operation for reading out the first signal, and a third readout operation for reading out the second signal on pixels in a second row. The control circuit performs a third reset operation on pixels of any one of rows in a period one before a period during which the second reset operation is performed.

20 Claims, 10 Drawing Sheets

(51) Int. Cl.
  *H04N 25/766* (2023.01)
  *H10F 39/00* (2025.01)
  *H10F 39/18* (2025.01)

(52) U.S. Cl.
  CPC .......... *H10F 39/182* (2025.01); *H10F 39/802* (2025.01); *H10F 39/8063* (2025.01)

(58) Field of Classification Search
  USPC ....................................................... 348/222.1
  See application file for complete search history.

(56) References Cited

U.S. PATENT DOCUMENTS

| | | |
|---|---|---|
| 2015/0373287 A1 | 12/2015 | Uchida |
| 2019/0082133 A1* | 3/2019 | Shikina .................. H04N 25/78 |
| 2020/0137279 A1 | 4/2020 | Seo |

* cited by examiner

FIG. 4

PHOTOELECTRIC CONVERSION DEVICE AND METHOD OF DRIVING PHOTOELECTRIC CONVERSION DEVICE

BACKGROUND

Technical Field

The aspect of the embodiments relates to a photoelectric conversion device and a method of driving a photoelectric conversion device.

Description of the Related Art

Japanese Patent Application Laid-Open No. 2016-021052 discloses an imaging device and a control method thereof capable of suppressing an increase in a readout time for acquiring a focus detection signal and obtaining good image quality by suppressing a difference in an exposure amount between rows used for focus detection calculation and other rows.

However, in the technology described in Japanese Patent Application Laid-Open No. 2016-021052, an amount of noise given to a pixel in which a readout operation is performed may vary depending on the row, and the image quality may be deteriorated.

SUMMARY

According to an embodiment of the present disclosure, there is provided a photoelectric conversion device including a pixel array unit in which a plurality of pixels each including a plurality of photoelectric conversion elements are arranged to form a plurality of rows and a plurality of columns, and a control circuit configured to control the plurality of pixels on a row-by-row basis, wherein each of the plurality of pixels is configured to be capable of outputting a first signal according to an amount of charge generated by a first number of photoelectric conversion elements among the plurality of photoelectric conversion elements and a second signal according to an amount of charge generated by a second number of photoelectric conversion elements among the plurality of photoelectric conversion elements which is greater than the first number, wherein the control circuit is configured to perform a first reset operation of resetting the plurality of photoelectric conversion elements and a first readout operation of reading out the second signal on pixels arranged in a first row among the plurality of rows, and perform a second reset operation of resetting the plurality of photoelectric conversion elements, a second readout operation of reading out the first signal, and a third readout operation for reading out the second signal on pixels arranged in a second row among the plurality of rows, wherein each of the first reset operation, the first readout operation, the second reset operation, the second readout operation, and the third readout operation is performed during one of a plurality of consecutive periods of the same length, and wherein the control circuit is configured to perform a third reset operation of resetting the plurality of photoelectric conversion elements on pixels in any one row of the plurality of rows in a period one before a period during which the second reset operation is performed among the plurality of periods.

According to another embodiment of the present disclosure, there is provided a photoelectric conversion device including a pixel array unit in which a plurality of pixels each including a plurality of photoelectric conversion elements are arranged to form a plurality of rows and a plurality of columns, and a control circuit configured to control the plurality of pixels on a row-by-row basis, wherein each of the plurality of pixels is configured to be capable of outputting a first signal according to an amount of charge generated by a first number of photoelectric conversion elements among the plurality of photoelectric conversion elements and a second signal according to an amount of charge generated by a second number of photoelectric conversion elements among the plurality of photoelectric conversion elements which is greater than the first number, wherein the pixel array unit includes a first region and a second region each defined by rows, wherein the control circuit is configured to perform a first reset operation of resetting the plurality of photoelectric conversion elements and a first readout operation of reading out the second signal on pixels arranged in the rows of the first region, and perform a second reset operation of resetting the plurality of photoelectric conversion elements, a second readout operation of reading out the first signal, and a third readout operation of reading out the second signal on pixels arranged in the rows of the second region, wherein each of the first reset operation, the first readout operation, the second reset operation, the second readout operation, and the third readout operation is performed during one of a plurality of consecutive periods of the same length, and wherein the control circuit is configured to perform a third reset operation of resetting the plurality of elements on pixels in another row during a period in which the first readout operation or the third readout operation is performed in each of the plurality of rows.

According to still another embodiment of the present disclosure, there is provided a method of driving a photoelectric conversion element including a pixel array unit in which a plurality of pixels each including a plurality of photoelectric conversion elements are arranged to form a plurality of rows and a plurality of columns, each of the plurality of pixels being configured to be capable of outputting a first signal according to an amount of charge generated by a first number of photoelectric conversion elements among the plurality of photoelectric conversion elements and a second signal according to an amount of charge generated by a second number of photoelectric conversion elements among the plurality of photoelectric conversion elements which is greater than the first number, and the pixel array unit including a first region including a first region and a second region each defined by rows, the method including performing a first reset operation of resetting the plurality of photoelectric conversion elements and a first readout operation of reading out the second signal on pixels arranged in the rows of the first region, and performing a second reset operation of resetting the plurality of photoelectric conversion elements, a second readout operation of reading out the first signal, and a third readout operation of reading out the second signal are performed on pixels arranged in the rows of the second region, wherein each of the first reset operation, the first readout operation, the second reset operation, the second readout operation, and the third readout operation is performed during one of a plurality of consecutive periods of the same length, and wherein the method further comprises performing a third reset operation of resetting the plurality of photoelectric conversion elements on pixels in another row during a period in which the first readout operation or the third readout operation is performed on pixels in each of the plurality of rows.

Further features of the disclosure will become apparent from the following description of exemplary embodiments with reference to the attached drawings.

BRIEF DESCRIPTION OF THE DRAWINGS

FIG. 4 is a diagram schematically illustrating an operation in the pixel array unit of the photoelectric conversion device according to the first embodiment of the disclosure.

DESCRIPTION OF THE EMBODIMENTS

Exemplary embodiments of the disclosure will now be described in detail in accordance with the accompanying drawings.

First Embodiment

Figure 1:
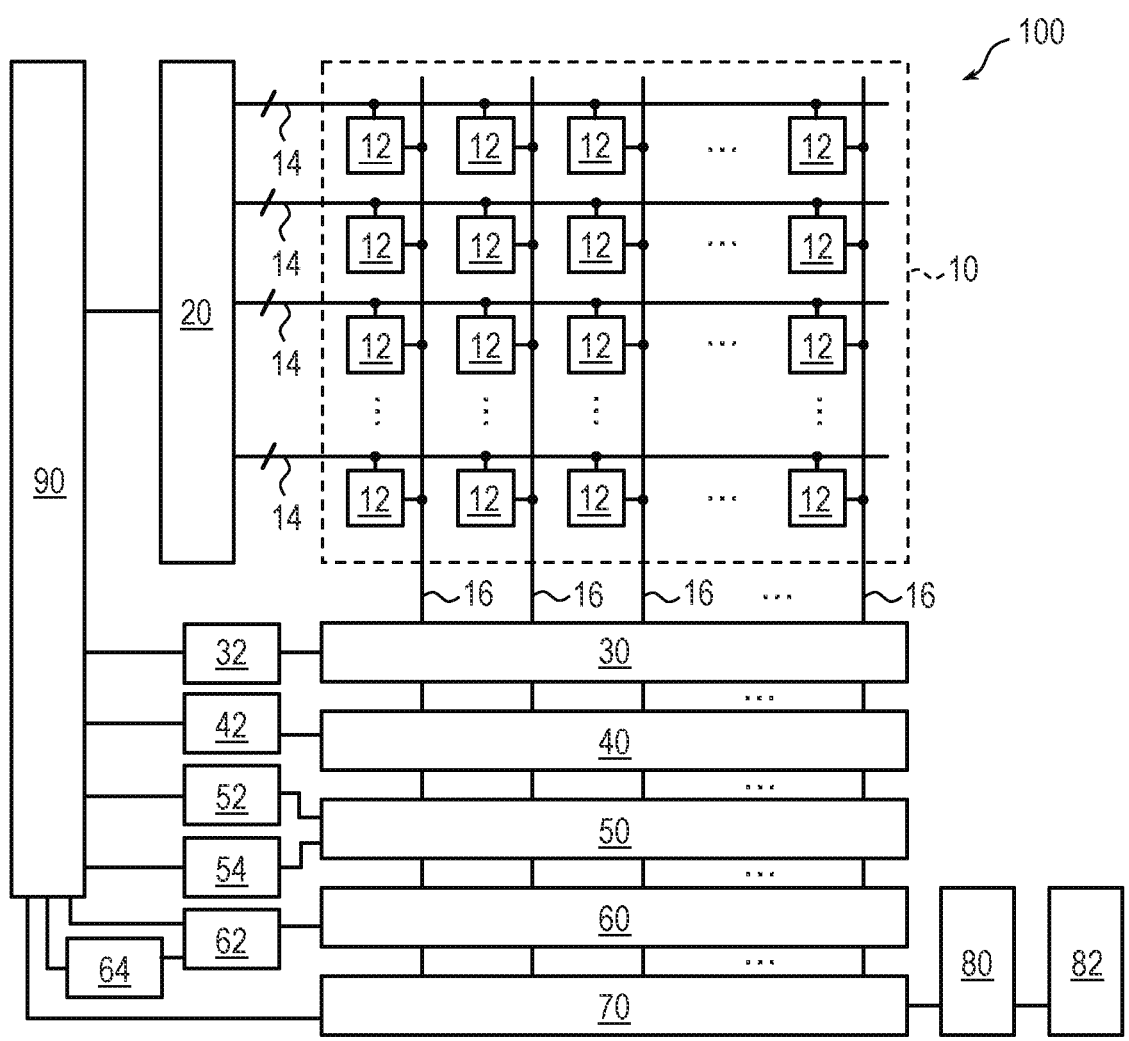
FIG. 1 is a block diagram illustrating a schematic configuration of a photoelectric conversion device according to a first embodiment of the disclosure.
Figure 2:
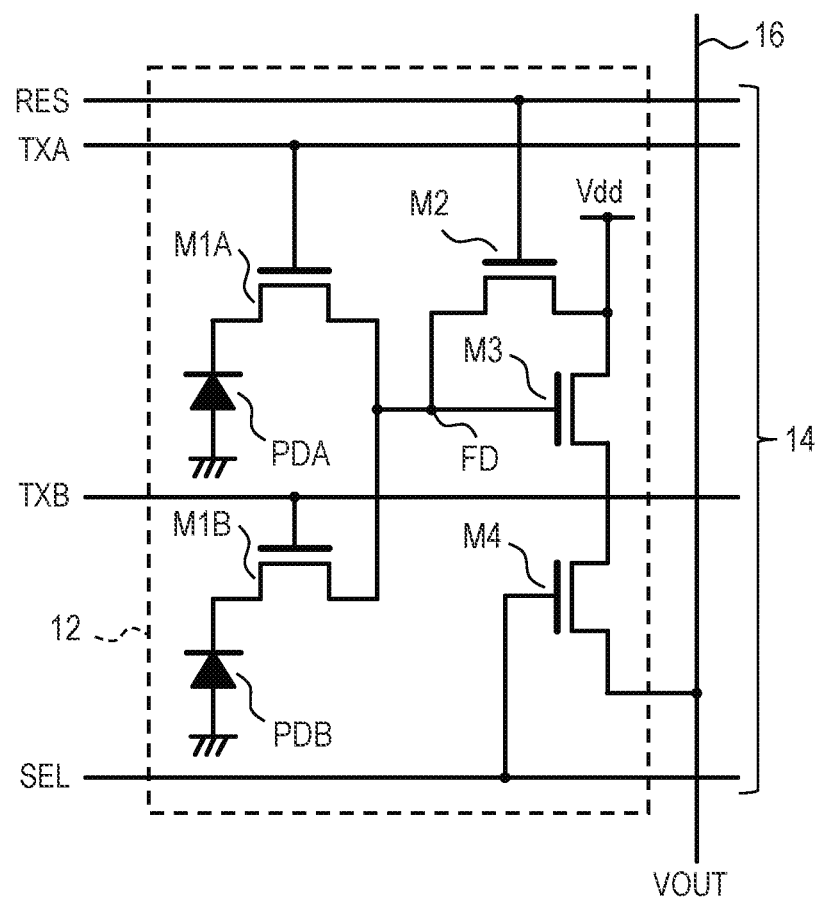
FIG. 2 is a circuit diagram illustrating a configuration example of a pixel in the photoelectric conversion device according to the first embodiment of the disclosure.
Figure 3:
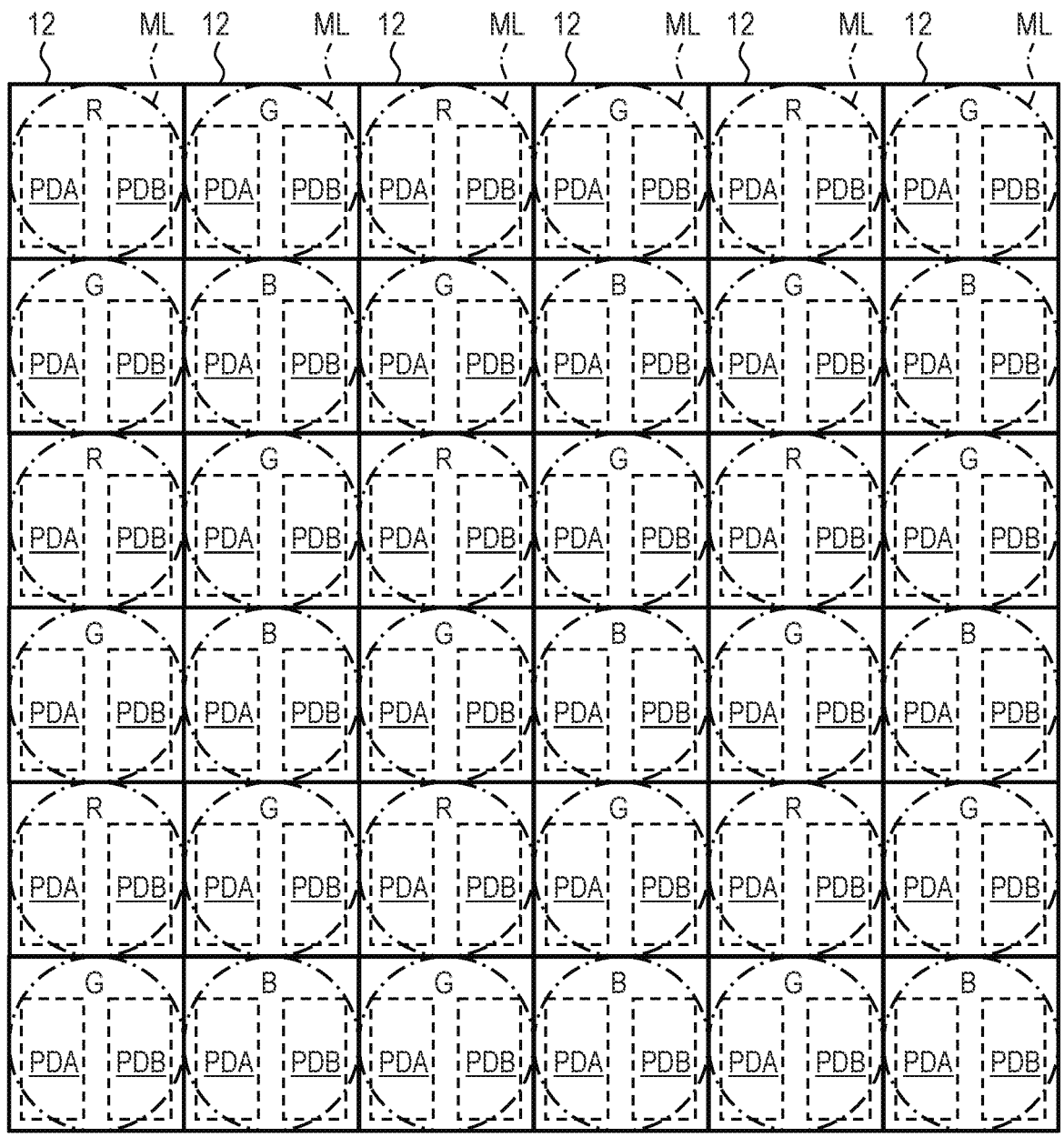
FIG. 3 is a plan view illustrating a configuration example of a pixel array unit in the photoelectric conversion device according to the first embodiment of the disclosure.

A structure of a photoelectric conversion device according to a first embodiment of the disclosure will be described with reference to FIG. 1 to FIG. 3. FIG. 1 is a block diagram illustrating a schematic configuration of a photoelectric conversion device according to the present embodiment. FIG. 2 is a circuit diagram illustrating a configuration example of a pixel in the photoelectric conversion device according to the present embodiment. FIG. 3 is a plan view illustrating a configuration example of a pixel array unit of the photoelectric conversion device according to the present embodiment.

As illustrated in FIG. 1, the photoelectric conversion device 100 according to the present embodiment includes a pixel array unit 10, a vertical scanning circuit 20, a readout circuit 30, an analog signal processing circuit 40, an AD conversion circuit 50, drive circuits 32, 42, and 52, and a reference signal generation circuit 54. The photoelectric conversion device 100 further includes a memory unit 60, a counter 62, a PLL 64, a horizontal scanning circuit 70, a digital signal processing circuit (DFE (Digital Front End)) 80, a signal output circuit 82, and a timing generator 90.

The pixel array unit 10 is provided with a plurality of pixels 12 arranged in a matrix over a plurality of rows and a plurality of columns. Each of the plurality of pixels 12 includes a photoelectric conversion element such as a photodiode, and outputs a pixel signal corresponding to an amount of incident light. In addition, in the pixel array unit 10, in addition to effective pixels which output pixel signals according to the amount of incident light, optical black pixels in which the photoelectric conversion units are shielded from light, dummy pixels which do not output signals, and the like may be arranged.

In each row of the pixel array unit 10, a control line 14 is arranged so as to extend in a first direction (lateral direction in FIG. 1). Each of the control lines 14 is connected to each of the pixels 12 on the corresponding row arranged in the first direction, and serves as a signal line common to these pixels 12. The first direction in which the control lines 14 extend may be referred to as a row direction or a horizontal direction. Each of the control lines 14 may include a plurality of signal lines. The control lines 14 are connected to the vertical scanning circuit 20.

In each column of the pixel array unit 10, a vertical output line 16 is arranged so as to extend in a second direction (vertical direction in FIG. 1) intersecting with the first direction. Each of the vertical output lines 16 is connected to each of the pixels 12 on the corresponding column arranged in the second direction, and serves as a signal line common to these pixels 12. The second direction in which the vertical output lines 16 extend may be referred to as a column direction or a vertical direction. Each of the vertical output lines 16 may include a plurality of output lines. The vertical output lines 16 are connected to the readout circuit 30 and the analog signal processing circuit 40.

The vertical scanning circuit 20 is a control circuit having a function of receiving a control signal supplied from the timing generator 90, generating a control signal for driving the pixels 12, and supplying the control signal to the pixels 12 via the control line 14. A logic circuit such as a shift register or an address decoder may be used for the vertical scanning circuit 20. Operations performed by the vertical scanning circuit 20 for the plurality of pixels 12 constituting the pixel array unit 10 includes a reset scan and a readout scan. The reset scan is an operation in which exposure is started by sequentially releasing the reset state of the photoelectric conversion elements of the pixels 12 in a part of the rows of the pixel array unit 10 or of the pixels 12 in all the rows of the pixel array unit 10 on a row-by-row basis and putting them in a charge accumulation state. The readout scan is an operation of sequentially outputting a signal corresponding to an amount of charge accumulated in the photoelectric conversion element from the pixels 12 in a part of the rows of the pixel array unit 10 or the pixels 12 in all the rows of the pixel array unit 10 on a row-by-row basis. The signals read out from the pixels 12 in units of rows are input to the analog signal processing circuit 40 via vertical output lines 16 provided in each column of the pixel array unit 10.

The readout circuit 30 has a function of reading out pixel signals from the pixels 12 arranged in the pixel array unit 10 and outputting them to the analog signal processing circuit 40. The readout circuit 30 may include, for example, a current source (not illustrated) for supplying a bias current to the pixel 12 via the vertical output line 16. The drive circuit 32 includes a pulse generation unit that generates a control signal for controlling the readout circuit 30, a reference bias circuit unit that generates a reference bias voltage to be supplied to the readout circuit 30, and the like.

The analog signal processing circuit 40 has a function of performing predetermined analog signal processing on analog pixel signals output from the respective columns of the pixel array unit 10 via the vertical output lines 16. The analog signal processing circuit 40 includes a signal holding unit that samples and holds an analog pixel signal, an analog amplification unit that amplifies an analog pixel signal, and the like. The drive circuit 42 includes a pulse generation unit that generates a control signal for controlling the analog signal processing circuit 40, a reference bias circuit unit that generates a reference bias voltage to be supplied to the analog signal processing circuit 40, and the like.

The AD conversion circuit 50 has a function of performing analog-to-digital (AD) conversion on the analog pixel signals of the respective columns processed by the analog signal processing circuit 40. The drive circuit 52 includes a pulse generation unit that generates a control signal for controlling the AD conversion circuit 50, a reference bias circuit unit that generates a reference bias voltage to be supplied to the AD conversion circuit 50, and the like. The reference signal generation circuit 54 has a function of generating a reference signal to be compared with an analog pixel signal during AD conversion and supplying the generated reference signal to the AD conversion circuit 50.

The memory unit 60 includes a plurality of column memories corresponding to each column of the pixel array unit 10, and has a function of holding a count value indicated by a count signal output from the counter 62 in the column memory according to an output from the AD conversion circuit 50. The count value held in the column memory of each column becomes a digital pixel signal obtained by AD conversion of the analog pixel signal. The counter 62 has a function of generating a count signal indicating a count value based on a reference clock generated by the PLL 64 and supplying the generated count signal to the memory unit 60. The PLL 64 receives a control signal supplied from the timing generator 90 and generates a reference clock to be supplied to the counter 62.

The horizontal scanning circuit 70 is a control circuit having a function of receiving a control signal supplied from the timing generator 90, generating a control signal for reading out a pixel signal from the memory unit 60, and supplying the control signal to the memory unit 60. The horizontal scanning circuit 70 sequentially scans the column memories of the respective columns of the memory unit 60, and sequentially outputs digital pixel signals held in the respective column memories to the digital signal processing circuit 80. A logic circuit such as a shift register or an address decoder may be used for the horizontal scanning circuit 70.

The digital signal processing circuit 80 has a function of performing predetermined digital signal processing on the digital pixel signal transferred from the memory unit 60 and outputting the digital pixel signal to the signal output circuit 82. Examples of the digital processing executed by the digital signal processing circuit 80 include arithmetic processing, amplification processing, and correction processing by CDS (correlated double sampling).

The signal output circuit 82 includes an external interface circuit, and has a function of outputting the digital pixel signal processed by the digital signal processing circuit 80 to the outside of the photoelectric conversion device 100. The external interface circuit included in the signal output circuit 82 is not particularly limited. For example, SerDes (SERializer/DESerializer) transmission circuits such as LVDS (Low Voltage Differential Signaling) circuit and SLVS (Scalable Low Voltage Signaling) circuit may be applied to the external interface circuit.

The timing generator 90 is a control circuit that generates control signals for controlling operations of the vertical scanning circuit 20, the drive circuits 32, 42, 52, the reference signal generation circuit 54, the counter 62, the PLL 64, the horizontal scanning circuit 70, and the like, and supplies the control signals to the respective functional blocks. The control signals for controlling the operations of the vertical scanning circuit 20, the drive circuits 32, 42, 52, the reference signal generation circuit 54, the counter 62, the PLL 64, the horizontal scanning circuit 70, and the like are not necessarily supplied from the timing generator 90. At least a part of these control signals may be supplied from the outside of the photoelectric conversion device 100.

Next, a configuration example of the pixel 12 in the photoelectric conversion device according to the present embodiment will be described with reference to FIG. 2.

As illustrated in, e.g., FIG. 2, the pixel 12 may include photoelectric conversion elements PDA and PDB, transfer transistors M1A and M1B, a reset transistor M2, an amplifier transistor M3, and a select transistor M4. The pixel 12 may include a microlens and a color filter arranged on an optical path until incident light is guided to the photoelectric conversion elements PDA and PDB. The microlens collects incident light to the photoelectric conversion elements PDA and PDB. The color filter selectively transmits light of a predetermined color.

The photoelectric conversion elements PDA and PDB are, for example, photodiodes. The photoelectric conversion element PDA has an anode connected to a reference voltage node and a cathode connected to a source of the transfer transistor MIA. The photoelectric conversion element PDB has an anode connected to the reference voltage node and a cathode connected to a source of the transfer transistor M1B. A drain of the transfer transistor M1A and a drain of the transfer transistor M1B are connected to a source of the reset transistor M2 and a gate of the amplifier transistor M3. A node FD to which the drain of the transfer transistor MIA, the drain of the transfer transistor M1B, the source of the reset transistor M2, and the gate of the amplifier transistor M3 are connected is a so-called floating diffusion. The floating diffusion includes a capacitance component (floating diffusion capacitance) and functions as a charge holding portion. The floating diffusion capacitance may include a p-n junction capacitance and an interconnection capacitance. A drain of the reset transistor M2 and a drain of the amplifier transistor M3 are connected to a node to which a power supply voltage (voltage Vdd) is supplied. A source of the amplifier transistor M3 is connected to a drain of the select transistor M4. A source of the select transistor M4 is connected to the vertical output line 16.

In the circuit configuration of FIG. 2, the control line 14 of each row includes four signal lines connected to a gate of the transfer transistor MIA, a gate of the transfer transistor MIB, a gate of the reset transistor M2, and a gate of the select transistor M4, respectively. A control signal TXA is supplied from the vertical scanning circuit 20 to the gate of the transfer transistor M1A of the pixel 12. A control signal TXB is supplied from the vertical scanning circuit 20 to the gate of the transfer transistor M1B of the pixel 12. A control signal RES is supplied from the vertical scanning circuit 20 to the gate of the reset transistor M2 of the pixel 12. A control signal SEL is supplied from the vertical scanning circuit 20 to the gate of the select transistor M4 of the pixel 12. In the case where each transistor is formed of an n-channel MOS transistor, when a high-level control signal is supplied from the vertical scanning circuit 20, the corresponding transistor is turned on. When a low-level control signal is supplied from the vertical scanning circuit 20, the corresponding transistor is turned off.

In the present embodiment, a description will be given assuming a case where electrons among electron-hole pairs generated in the photoelectric conversion elements PDA and PDB by light incidence are used as a signal charge. When electrons are used as the signal charge, each transistor included in the pixel 12 may be formed of an n-channel MOS transistor. However, the signal charge is not limited to electrons, and holes may be used as the signal charge. When holes are used as the signal charge, the conductivity type of each transistor is opposite to that described in the present embodiment. Note that the term "source" or "drain" of the MOS transistor may vary depending on the conductivity type of the transistor or the target function. Some or all of names of a source and a drain used in the present embodiment are sometimes referred to as reverse names.

The photoelectric conversion elements PDA and PDB convert (photoelectrically convert) an incident light into electric charge of an amount corresponding to an amount of the incident light, and accumulate the generated electric charge. The transfer transistor M1A transfers charge held in the photoelectric conversion element PDA to the node FD by turning on. The transfer transistor M1B transfers charge held in the photoelectric conversion element PDB to the node FD by turning on. The charges transferred from the photoelectric conversion elements PDA and PDB are held in the capacitance component (floating diffusion capacitance) of the node FD. As a result, the node FD becomes a potential corresponding to an amount of charges transferred from the photoelectric conversion elements PDA and PDB by charge-voltage conversion by the floating diffusion capacitance.

The select transistor M4 connects the amplifier transistor M3 to the vertical output line 16 by turning on. The amplifier transistor M3 is configured such that the voltage Vdd is supplied to the drain and a bias current is supplied from a current source (not illustrated) to the source via the select transistor M4, and constitutes an amplification unit (source follower circuit) having a gate as an input node. Accordingly, the amplifier transistor M3 outputs a signal based on the voltage of the node FD to the vertical output line 16 via the select transistor M4. In this sense, the amplifier transistor M3 and the select transistor M4 forms an output unit that outputs a pixel signal corresponding to an amount of charge held in the node FD.

The reset transistor M2 has a function of controlling supply of a voltage (the voltage Vdd) for resetting the node FD serving as a charge holding portion to the FD node. The reset transistor M2 resets the node FD to a voltage corresponding to the voltage Vdd by turning on. At this time, by simultaneously turning on the transfer transistor M1A, the photoelectric conversion element PDA may be reset to a voltage corresponding to the voltage Vdd. Similarly, by simultaneously turning on the transfer transistor M1B, the photoelectric conversion element PDB may be reset to a voltage corresponding to the voltage Vdd.

The pixel 12 including a plurality of photoelectric conversion elements as in the present embodiment may output a plurality of kinds of signals. The pixel 12 may output a first signal corresponding to an amount of charge generated by a first number of photoelectric conversion elements among the plurality of photoelectric conversion elements and a second signal corresponding to an amount of charge generated by a second number of photoelectric conversion elements among the plurality of photoelectric conversion elements which is larger than the first number. When the pixel 12 includes two photoelectric conversion elements, the first signal may be an A-signal to be described later, and the second signal may be an (A+B)-signal to be described later.

Next, an arrangement of the pixels 12 in the pixel array unit 10 will be described with reference to FIG. 3. FIG. 3 illustrates 36 pixels 12 arranged in an array of 6 rows×6 columns among the plurality of pixels 12 constituting the pixel array unit 10. Each rectangular region partitioned by a solid line indicates the pixel 12.

In FIG. 3, a color of the color filter included in each pixel 12 is denoted by any one of symbols R (Red), G (Green), and B (Blue). The pixel 12 denoted by "R" is a pixel 12 provided with a red filter having a transmission wavelength band in a red wavelength band. The pixel 12 denoted by "G" is a pixel 12 provided with a green filter having a transmission wavelength band in a green wavelength band. The pixel 12 denoted by "B" is a pixel 12 provided with a blue filter having a transmission wavelength band in a blue wavelength band. Hereinafter, a pixel 12 provided with a red filter may be referred to as an R pixel, a pixel 12 provided with a green filter may be referred to as a G pixel, and a pixel 12 provided with a blue filter may be referred to as a B pixel.

The R pixel, the G pixel, and the B pixel may be arranged according to a so-called Bayer arrangement. As illustrated in FIG. 3, for example, in a two-row×two-column pixel block which is a minimum repeating unit, two G pixels are arranged at one diagonal position, and an R pixel and a B pixel are arranged at the other diagonal position. The pixel array unit 10 is formed by repeatedly arranging the pixel blocks in the row direction and the column direction.

FIG. 3 illustrates the photoelectric conversion elements PDA and PDB and the microlens ML among the components of each pixel 12. As illustrated in FIG. 3, the photoelectric conversion elements PDA and PDB constituting one pixel 12 share one microlens ML. In other words, the photoelectric conversion elements PDA and PDB are configured to receive light that has passed through different pupil regions among light incident on the imaging optical system. With this configuration, a signal (A-signal) corresponding to an amount of charge generated by the photoelectric conversion element PDA and a signal (B-signal) corresponding to an amount of charge generated by the photoelectric conversion element PDB may be used as a signal for focus detection. A-signal obtained by adding the A-signal and the B-signal ((A+B)-signal) may be used as a signal for image generation.

Figure 4:
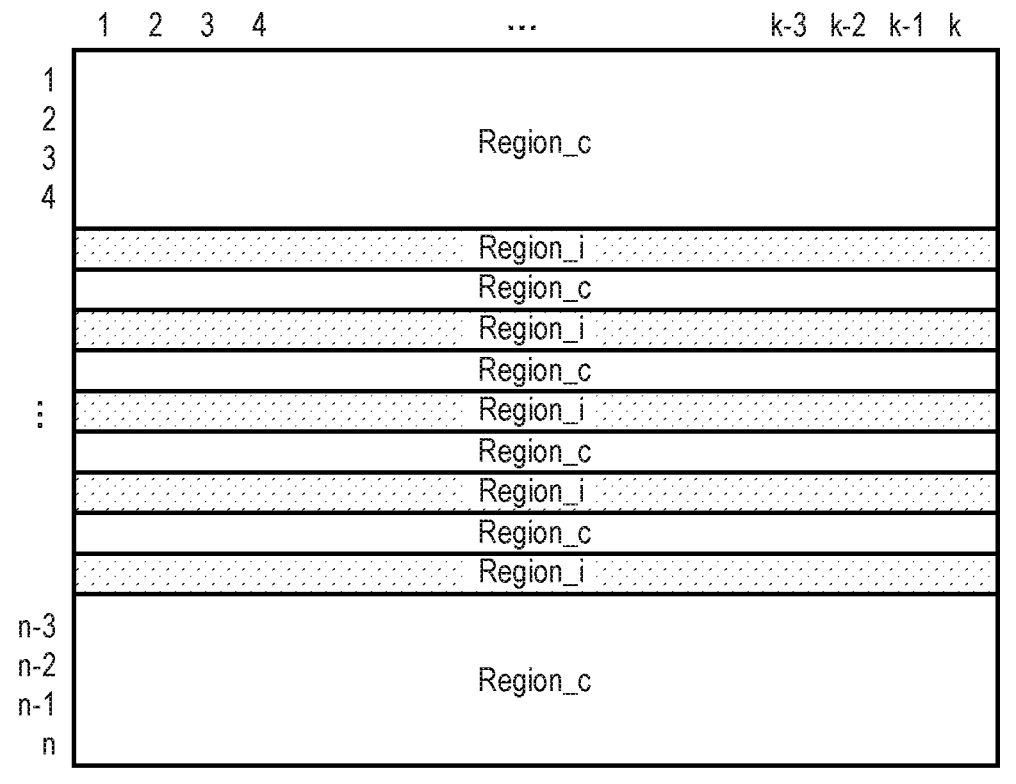
Figure 5A:
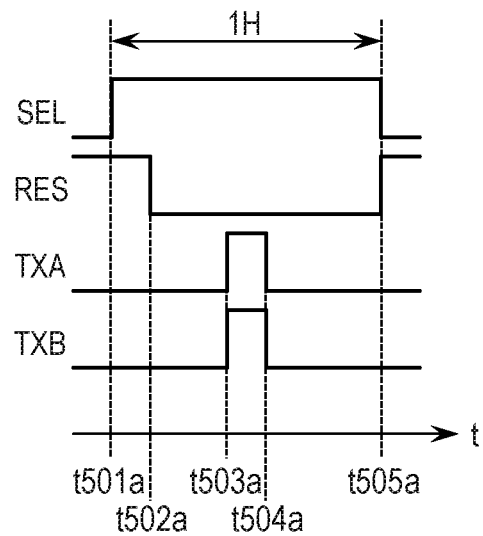
FIG. 5A, FIG. 5B, and FIG. 5C are timing charts illustrating a readout operation of the pixel in the photoelectric conversion device according to the first embodiment of the disclosure.
Figure 5B:
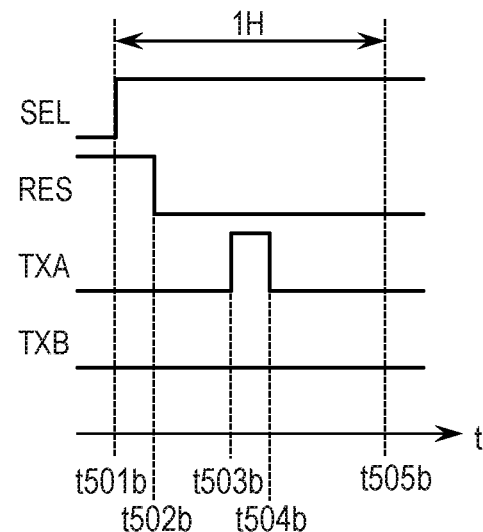
Figure 5C:
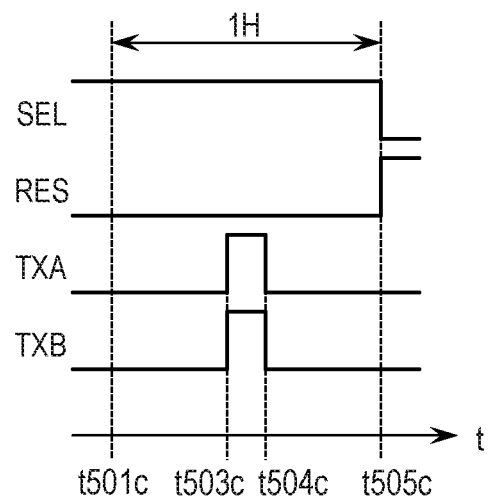
Figure 5D:
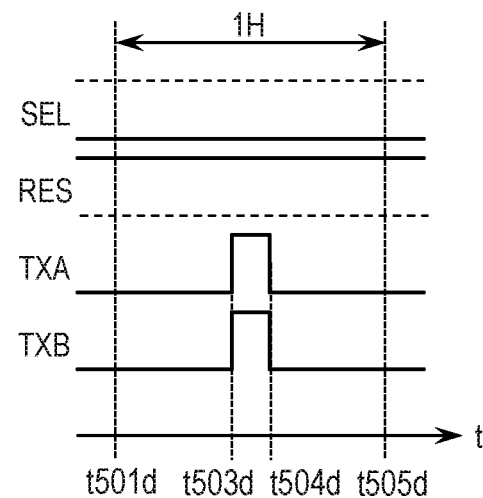
FIG. 5D is a timing chart illustrating a reset operation of the pixel in the photoelectric conversion device according to the first embodiment of the disclosure.
Figure 6:
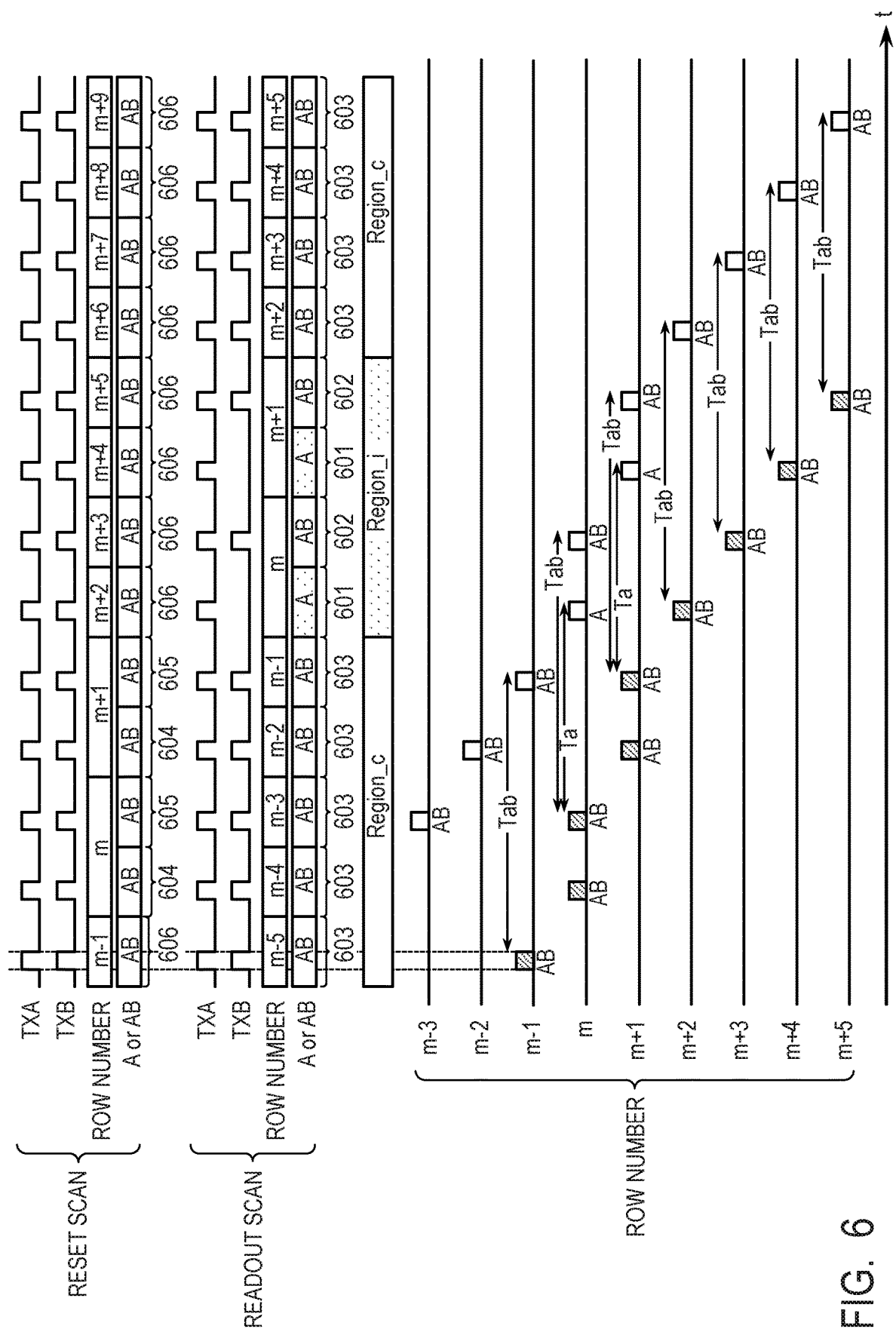
FIG. 6 is a timing chart illustrating a method of driving the photoelectric conversion device according to the first embodiment of the disclosure.

Next, a method of driving the photoelectric conversion device according to the present embodiment will be described with reference to FIG. 4 to FIG. 6. FIG. 4 is a diagram schematically illustrating an operation in the pixel array unit of the photoelectric conversion device according to the present embodiment. FIG. 5A to FIG. 5D are timing charts illustrating a readout operation and a reset operation of the pixel in the photoelectric conversion device according to the present embodiment. FIG. 6 is a timing chart illustrating a method of driving the photoelectric conversion device according to the present embodiment.

FIG. 4 schematically illustrates operations of respective rows when a pixel array of n-number rows×k-number columns is assumed as the pixel array unit 10. Each of the plurality of rows constituting the pixel array unit 10 is defined as one of a first region Region_c and a second region Region_i, for example, as illustrated in FIG. 4. The (A+B)-signal is read out from the pixels 12 arranged in the row defined as the first region Region_c, and is used for image generation. The A-signal and the (A+B)-signal are read out from the pixels 12 arranged in the row defined as the second region Region_i, and are used for image generation and focus detection calculation. The number of signals read out from the pixels 12 arranged in the first region Region_c is smaller than the number of signals read out from the pixels 12 arranged in the second region Region_i. When a plurality of second regions Region_i are set in the pixel array unit 10 as illustrated in FIG. 4, for example, the number of rows constituting each of the second regions Region_i may be the same or different.

Next, a readout operation of the pixels 12 in the row defined as the first region Region_c will be described with reference to FIG. 5A. FIG. 5A is a timing chart illustrating a readout operation performed on the pixels 12 in the row defined as the first region Region_c.

A period from time t501a to time t505a illustrated in FIG. 5A is a period during which the (A+B)-signal is read out from the pixel 12 of the row defined as the first region Region_c.

During a period before the time t501a, the control signals SEL, TXA, and TXB are at low-level, and the control signal RES is at high-level. At this time, the reset transistor M2 is turned on in response to the high-level control signal RES, and the node FD is reset to a voltage corresponding to the voltage Vdd.

At time t501a, the vertical scanning circuit 20 controls the control signal SEL to high-level. Thus, the select transistor M4 is turned on, and the amplifier transistor M3 is connected to the vertical output line 16 via the select transistor M4. That is, the pixel 12 is selected, and the pixel signal may be output from the pixel 12 to the vertical output line 16.

At time t502a, the vertical scanning circuit 20 controls the control signal RES to low-level. As a result, the reset transistor M2 is turned off, and the reset state of the node FD is released. When the reset transistor M2 is turned off, the potential of the node FD is reduced to a predetermined potential by a capacitive coupling with the gate of the reset transistor M2. The voltage of the node FD settled after the reset transistor M2 turns off is the reset voltage of the node FD. A pixel signal (N-signal) corresponding to the reset voltage of the node FD is output to the vertical output line 16.

During a period from time t503a to time t504a, the vertical scanning circuit 20 controls the control signals TXA and TXB to high-level. As a result, the transfer transistors M1A and M1B are turned on, and charges accumulated in the photoelectric conversion elements PDA and PDB are transferred to the node FD. The node FD becomes a voltage corresponding to an amount of charge transferred from the photoelectric conversion elements PDA and PDB by charge-voltage conversion by the floating diffusion capacitance. A pixel signal (S-signal) corresponding to the voltage of the node FD is output to the vertical output line 16. This signal is an (A+B)-signal.

At subsequent time t505a, the vertical scanning circuit 20 controls the control signal RES to high-level. Thus, the reset transistor M2 is turned on, and the node FD is reset. Similarly, at the time t505a, the vertical scanning circuit 20 controls the control signal SEL to low-level. As a result, the select transistor M4 is turned off, and the selection of the pixel 12 is released.

Next, a readout operation of the pixels 12 in the row defined as the second region Region_i will be described with reference to FIG. 5B and FIG. 5C. FIG. 5B and FIG. 5C are timing diagrams illustrating a readout operation performed on the pixels 12 in the row defined as the second region Region_i.

A period from time t501b to time t505b illustrated in FIG. 5B is a period in which the A-signal is read out from the pixel 12 of the row defined as the second region Region_i.

During a period before the time t501b, the control signals SEL, TXA, and TXB are at low-level, and the control signal RES is at high-level. At this time, the reset transistor M2 is turned on in response to the high-level control signal RES, and the node FD is reset to a voltage corresponding to the voltage Vdd.

At time t501b, the vertical scanning circuit 20 controls the control signal SEL to high-level. Thus, the select transistor M4 is turned on, and the amplifier transistor M3 is connected to the vertical output line 16 via the select transistor M4. That is, the pixel 12 is selected, and the pixel signal may be output from the pixel 12 to the vertical output line 16.

At time t502b, the vertical scanning circuit 20 controls the control signal RES to low-level. As a result, the reset transistor M2 is turned off, and the reset state of the node FD is released. A pixel signal (N-signal) corresponding to the reset voltage of the node FD is output to the vertical output line 16.

During a period from time t503b to time t504b, the vertical scanning circuit 20 controls the control signal TXA to high-level. As a result, the transfer transistor M1A is turned on, and charge accumulated in the photoelectric conversion element PDA is transferred to the node FD. Then, the node FD becomes a voltage corresponding to an amount of charge transferred from the photoelectric conversion element PDA by charge-voltage conversion by the floating diffusion capacitance. A pixel signal (S-signal) corresponding to the voltage of the node FD is output to the vertical output line 16. This signal is the A-signal.

After the A-signal is read out, the operation is shifted to the operation illustrated in FIG. 5C. A period from time t501c to time t505c illustrated in FIG. 5C is a period during which the (A+B)-signal is read out from the pixel 12 of the row defined as the second region Region_i. After reading out the A-signal, the node FD is not reset, and the charge transferred from the photoelectric conversion element PDA is held in the node FD as it is.

During a period from time t503c to time t504c, the vertical scanning circuit 20 controls the control signals TXA and TXB to high-level. As a result, the transfer transistors M1A and M1B are turned on, charges accumulated in the photoelectric conversion element PDB are transferred to the node FD, and are added to charge transferred from the photoelectric conversion element PDA at the node FD. The node FD becomes a voltage corresponding to an amount of charge transferred from the photoelectric conversion elements PDA and PDB by charge-voltage conversion by the floating diffusion capacitance. A pixel signal (S-signal) corresponding to the voltage of the node FD is output to the vertical output line 16. This signal is the (A+B)-signal.

At the subsequent time t505c, the vertical scanning circuit 20 controls the control signal RES to high-level. Thus, the reset transistor M2 is turned on, and the node FD is reset. Similarly, at time t505c, the vertical scanning circuit 20 controls the control signal SEL to low-level. As a result, the select transistor M4 is turned off, and the selection of the pixel 12 is released.

Next, the reset operation of the pixel 12 will be described with reference to FIG. 5D. FIG. 5D is a timing chart illustrating a reset operation of the pixels 12. The reset operation of the pixels 12 in the row defined as the first region Region_c and the reset operation of the pixels 12 in the row defined as the second region Region_i are the same.

A period from time t501d to time t505d illustrated in FIG. 5D is a period during which the reset operation of the pixel 12 is performed.

At time t501d, the control signals SEL, TXA, and TXB are at low-level, and the control signal RES is at high-level. At this time, the reset transistor M2 is turned on in response to the high-level control signal RES, and the node FD is in the reset state. During a period in which the reset operation of the pixel 12 is performed, the select transistor M4 is maintained in an off-state.

At time t503d, the vertical scanning circuit 20 controls the control signals TXA and TXB to high-level. As a result, the transfer transistors M1A and M1B are turned on, and the photoelectric conversion elements PDA and PDB are reset to a predetermined voltage corresponding to the voltage Vdd via the node FD.

At time t504d, the vertical scanning circuit 20 controls the control signals TXA and TXB to low-level. As a result, the transfer transistors M1A and M1B are turned off, and the reset state of the photoelectric conversion elements PDA and PDB is released. In the photoelectric conversion elements PDA and PDB, accumulation of charge generated by a photoelectric conversion (exposure period) is started.

As described above, the (A+B)-signal is read out for the row of the first region Region_c, whereas the A-signal and the (A+B)-signal are read out for the row of the second region Region_i. Therefore, in the second region Region_i, it takes a longer time to read out than in the first region Region_c, and there is a possibility that a difference in exposure amount occurs. Therefore, in the present embodiment, the time required to read out the (A+B)-signal in the row of the first region Region_c, the time required to read out the A-signal in the row of the second region Region_i, and the time required to read the (A+B)-signal are set to the same length.

Here, a length of a readout time of one row of the first region Region_c is defined as a length of a readout time of one unit serving as a reference (unit readout period or unit period), and is expressed as 1H. Each of the length of the readout period during which the readout operation of FIG. 5A is performed, the length of the readout period during which the readout operation of FIG. 5B is performed, and the length of the readout period during which the readout operation of FIG. 5C is performed is set to 1H, i.e., the length of one unit readout period.

When each row of the second region Region_i is read out, the readout of the A-signal and the readout of the (A+B)-signal are performed, and therefore, the readout period in each row of the second region Region_i is a length corresponding to two unit readout cycles, i.e., 2H. When each row of the first region Region_c is read out, the readout of the (A+B)-signal is performed, so that the readout period in each row of the first region Region_c is a length corresponding to one unit readout period, i.e., 1H. That is, the readout time of each row of the second region Region_i is twice the readout time of each row of the first region Region_c. This makes it possible to obtain an image with no difference in exposure amount even in the slit rolling operation.

Next, a slit rolling operation in the case where the length of the readout period in the first region Region_c and the length of the readout period of each signal in the second region Region_i are the same will be described with reference to FIG. 6.

In an upper part of FIG. 6, for each of the reset scan and the readout scan, the row number to be processed, the control signals TXA and TXB supplied to the row, and the photoelectric conversion element to be processed are illustrated for each unit readout cycle along the time axis. In "A or AB" in the column of the reset scan, "A" indicates a case where the photoelectric conversion element PDA is reset, and "AB" indicates a case where the photoelectric conversion elements PDA and PDB are reset. Further, in "A or AB" in the column of the readout scan, "A" indicates a case where the A-signal is readout, and "AB" indicates a case where the (A+B)-signal is readout.

In a lower part of FIG. 6, timings at which the reset operation and the readout operation are performed for each of the (m−3)-th to (m+5)-th rows are represented by rectangular blocks. In the lower part of FIG. 6, shaded blocks indicate the reset operation, and white blocks indicate the readout operation. "AB" attached to the block indicating the reset operation indicates that the reset operation is performed on the photoelectric conversion elements PDA and PDB. "A" attached to a block indicating a readout operation indicates that the A-signal is readout. "AB" attached to the block indicating the readout operation indicates that the (A+B)-signal is readout.

Here, among the (m−5)-th to (m+5)-th rows illustrated in FIG. 6, the (m−5)-th to (m−1)-th rows and the (m+2)-th to (m+5)-th rows are located in the first region Region_c, and the m-th and (m+1)-th rows are located in the second region Region_i. The length of the reset period 606 of the pixels 12 and the length of the (A+B)-signal readout period 603 in the first region Region_c are each 1H. The length of the reset periods 604 and 605 of the pixels 12, the length of the A-signal readout period 601, and the length of the (A+B)-signal readout period 602 in the second region Region_i are each 1H. Each of the readout periods 601, 602, and 603 and the reset periods 604, 605, and 606 is executed during one of a plurality of consecutive periods of the same length (length of a unit readout period).

In the slit rolling operation, the reset scan is started first, and then the readout scan is performed, whereby the accumulation time in each row is kept constant. FIG. 6 illustrates an operation example when the accumulation time Tab of the (A+B)-signal is 4H. As described above, 1H denotes a readout time (unit readout cycle, unit cycle) for one row of the first region Region_c. As illustrated in the upper part of FIG. 6, the row number of the reset scan is advanced by four rows with respect to the row number of the readout scan, whereby such an operation is realized. The length of the accumulation time may be defined as a period from a timing at which the transfer transistors M1A and M1B are turned off in the reset operation to a timing at which the transfer transistors M1A and M1B are turned off in the readout operation.

The reset operation for the pixels 12 positioned in the row of the first region Region_c is performed in the reset period 606. That is, in the reset period 606, the charge accumulated in the photoelectric conversion element PDA and the charge accumulated in the photoelectric conversion element PDB are reset. Note that the reset operation in the reset period 606 is performed according to the timing diagram of FIG. 5D. The readout of the (A+B)-signal with respect to the pixel 12 positioned in the row of the first region Region_c is performed in the readout period 603. That is, in the readout period 603, charge accumulated in the photoelectric conversion elements PDA and PDB are transferred to the node FD. Note that the readout operation in the readout period 603 is performed according to the timing diagram of FIG. 5A.

The reset operation of the pixels 12 positioned in the row of the second region Region_i is performed in each of the reset periods 604 and 605. That is, in the reset periods 604 and 605, charge accumulated in the photoelectric conversion element PDA and charge accumulated in the photoelectric conversion element PDB are reset. Note that the reset operation in the reset periods 604 and 605 is performed according to the timing diagram of FIG. 5D. In the readout operation of the pixel 12 positioned in the row of the second region Region_i, the readout of the A-signal is performed in the readout period 601, and the readout of the (A+B)-signal is performed in the readout period 602. That is, charge accumulated in the photoelectric conversion element PDA is transferred to the node FD in the readout period 601, and charge accumulated in the photoelectric conversion element PDB is transferred to the node FD in the readout period 602. Note that the readout operation in the readout period 601 is performed according to the timing diagram of FIG. 5B, and the readout operation in the readout period 602 is performed according to the timing diagram of FIG. 5C.

In the present embodiment, as illustrated in FIG. 6, the readout operation of the A-signal and the (A+B)-signal in the pixels 12 positioned in the row of the second region Region_i is performed for 1H. By executing the readout operation of the pixels 12 positioned in the row of the second region Region_i in this manner, the accumulation time Tab may be kept constant in both the first region Region_c and the second region Region_i. At this time, timings at which the pulses of the control signals TXA and TXB are output (in particular, timings at which the transfer transistors M1A and M1B are turned off (timings at which the pulses of the control signals TXA and TXB fall)) is the same in each readout period.

Further, in the present embodiment, in the pixel 12 in the second region Region_i, in addition to the reset period 605, the reset operation of the photoelectric conversion elements PDA and PDB is also performed 4H before the readout operation of the A-signal (reset period 604). By performing the reset operation of the photoelectric conversion elements PDA and PDB in this manner, each of the readout periods 602 and 603 of the (A+B)-signal used for image generation becomes a period overlapping one of the reset periods 604, 605 and 606. In each of the reset periods 604, 605, and 606, the reset operation of the photoelectric conversion elements PDA and PDB is performed. In other words, the number of photoelectric conversion elements reset in each pixel 12 in the reset periods 604, 605, and 606 is the same. Therefore, the noise generation conditions affecting the readout operation in accordance with the reset operation are the same in the readout periods 602 and 603.

Different from the driving method of the present embodiment, when the photoelectric conversion element PDA is reset in the reset period 604, the reset operation performed in the period overlapping with the readout periods 602 and 603 may vary depending on the readout row. In such a case, noise given to the readout scan by the reset scan varies for each row, and as a result, horizontal stripe-shaped noise may be generated in the generated image. In this respect, in the driving method of the present embodiment, the reset operation performed in the period overlapping with the readout periods 602 and 603 is the same, and the noise in the form of horizontal stripes accompanying the reset operation is prevented from being superimposed on the generated image, and a better image may be obtained.

In the present embodiment, since the accumulation time Ta of the A-signal is the time (3H) from the pixel reset to the transfer of the charge from the photoelectric conversion element PDA to the node FD, the accumulation time Ta is shorter by 1H than the accumulation time Tab of the (A+B)-signal. Depending on the object or the like, the difference may affect the accuracy degradation of the focus detection operation. In such a case, the correction may be performed by multiplying the A-signal by a gain before the focus detection calculation.

As described above, according to the present embodiment, in the photoelectric conversion device provided with the function of acquiring the focus detection signal, it is possible to suppress variation in the amount of noise for each row while suppressing an increase in the readout time for acquiring the focus detection signal.

Second Embodiment

Figure 7:
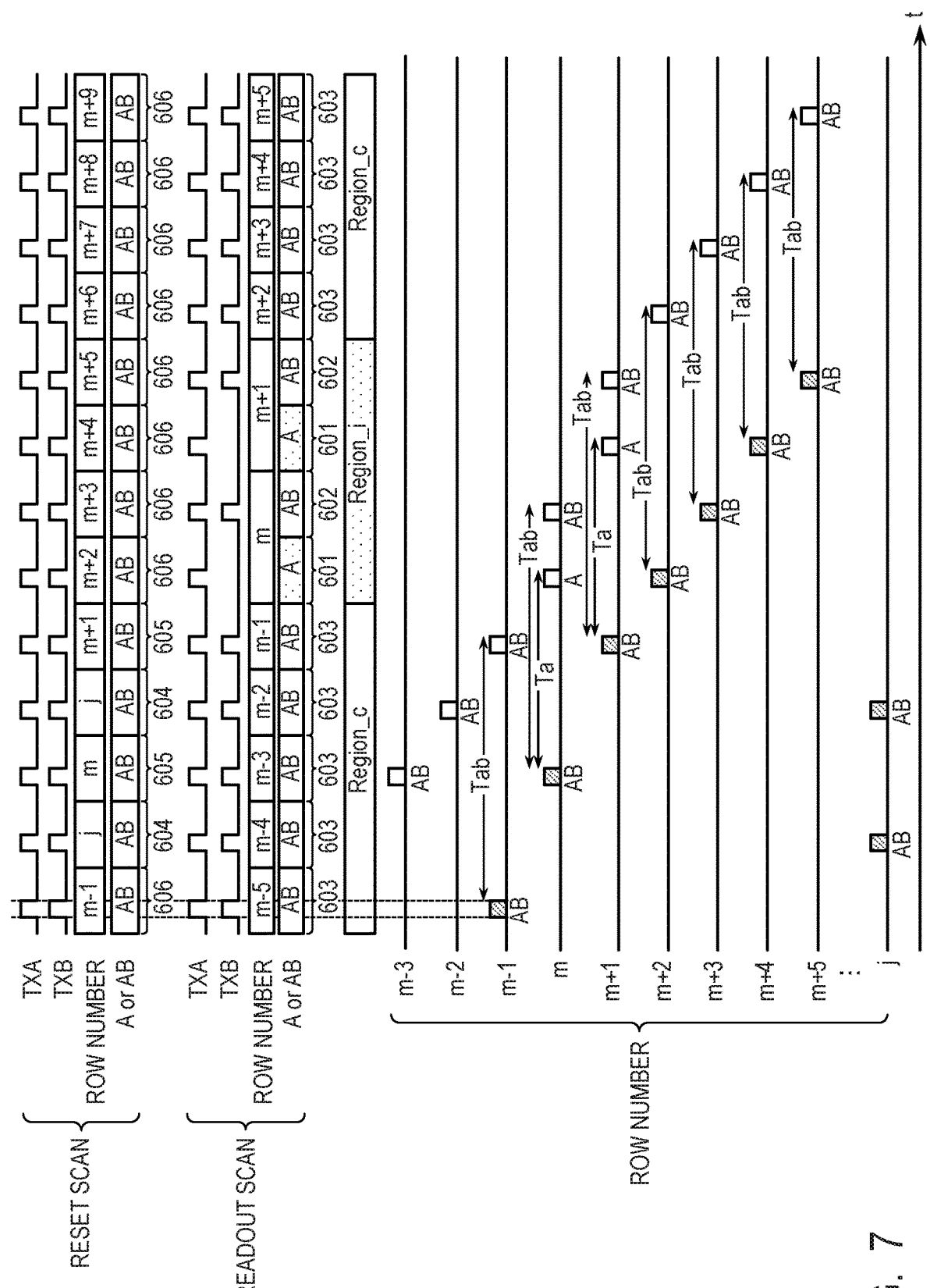
FIG. 7 is a timing chart illustrating a method of driving the photoelectric conversion device according to a second embodiment of the disclosure.

A method of driving a photoelectric conversion device according to a second embodiment of the disclosure will be described with reference to FIG. 7. Components similar to those of the photoelectric conversion device according to the first embodiment are denoted by the same reference numerals, and description thereof will be omitted or simplified. FIG. 7 is a timing chart illustrating a method of driving a photoelectric conversion device according to the present embodiment.

In the present embodiment, another method of driving the photoelectric conversion device described in the first embodiment will be described. In the following description, points different from the photoelectric conversion device and the driving method thereof according to the first embodiment will be mainly described, and overlapping descriptions will be appropriately omitted.

In the first embodiment, as illustrated in FIG. 6, in a period 1H before the reset period 605 is executed in a certain row of the second region Region_i, the reset period 604 is executed for the certain row. On the other hand, in the present embodiment, in a period 1H before the reset period 605 is executed in a certain row of the second region Region_i, the reset period 604 is executed for a j-th row different from the certain row.

Also in the case where the reset period 604 is executed for the j-th row different from the row in which the reset period 605 is executed, each of the readout periods 602 and 603 of the (A+B)-signal used for image generation is a period overlapping one of the reset periods 604, 605 and 606. Therefore, the noise generation conditions affecting the readout operation in accordance with the reset operation are the same in the readout periods 602 and 603. Thereby, it is possible to prevent horizontal stripe-shaped noise accompanying the reset operation from being superimposed on the generated image, and to obtain a better image.

The j-th line is not particularly limited. For example, the j-th row may be a row before the readout operation, a row after the readout operation, or a row without the readout operation.

As described above, according to the present embodiment, in the photoelectric conversion device provided with the function of acquiring the focus detection signal, it is possible to suppress variation in the amount of noise for each row while suppressing an increase in the readout time for acquiring the focus detection signal.

Third Embodiment

An imaging system according to a third embodiment of the disclosure will be described with reference to FIG. 8.

Figure 8:
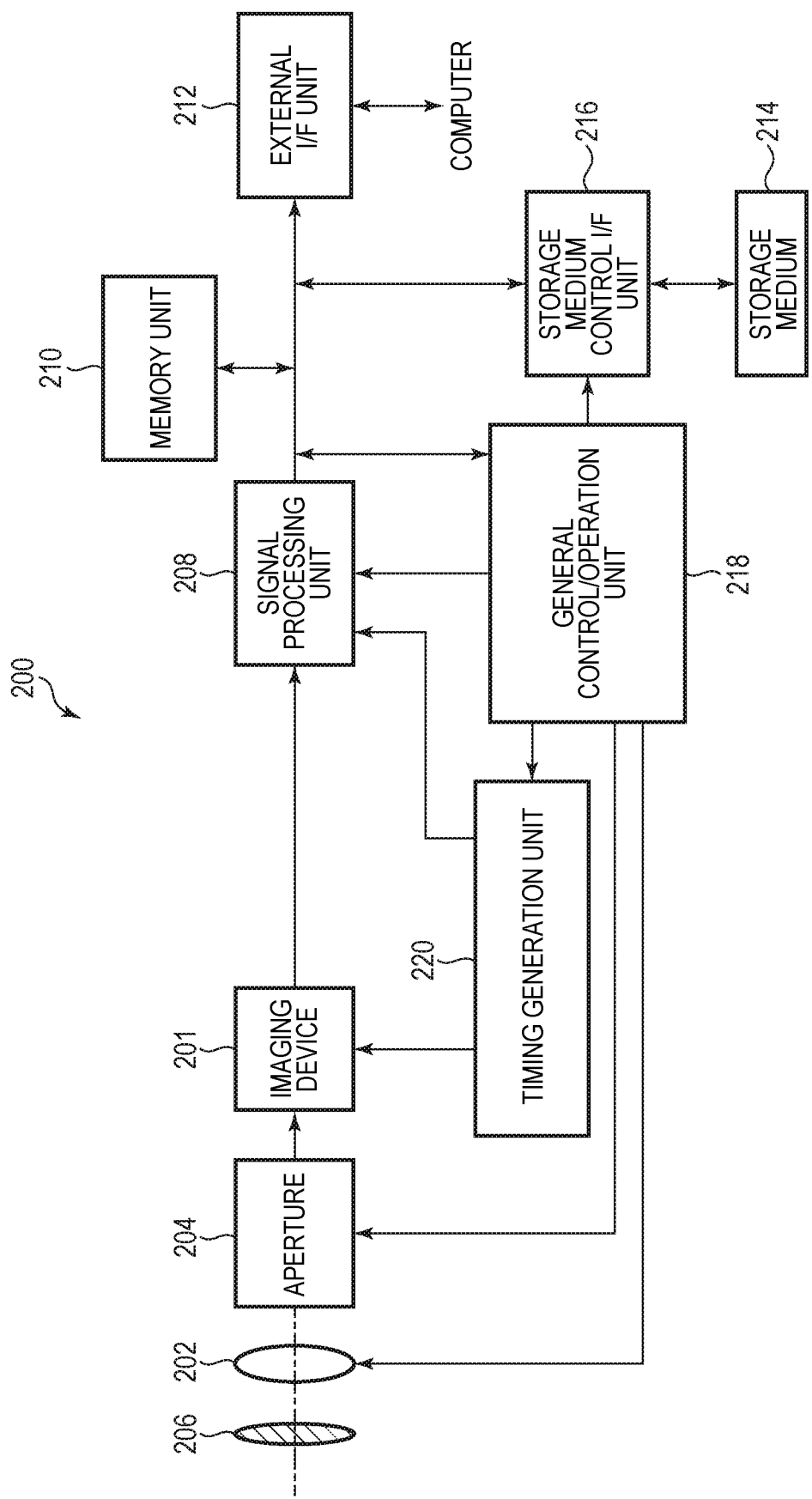
FIG. 8 is a block diagram illustrating a schematic configuration of an imaging system according to a third embodiment of the disclosure.

FIG. 8 is a block diagram illustrating a schematic configuration of the imaging system according to the present embodiment.

The photoelectric conversion device 100 described in the first and second embodiments may be applied to various imaging systems. Examples of applicable imaging systems include digital still cameras, digital camcorders, surveillance cameras, copying machines, facsimiles, mobile phones, on-vehicle cameras, observation satellites, and the like. A camera module including an optical system such as a lens and an imaging device is also included in the imaging system. FIG. 8 is a block diagram of a digital still camera as an example of these.

The imaging system 200 illustrated in FIG. 8 includes an imaging device 201, a lens 202 for forming an optical image of an object on the imaging device 201, an aperture 204 for varying the amount of light passing through the lens 202, and a barrier 206 for protecting the lens 202. The lens 202 and the aperture 204 form an optical system that collect light on the imaging device 201. The imaging device 201 is the photoelectric conversion device 100 described in the first or second embodiment, and converts an optical image formed by the lens 202 into image data.

The imaging system 200 also includes a signal processing unit 208 that processes an output signal output from the imaging device 201. The signal processing unit 208 generates image data from a digital signal output from the imaging device 201. The signal processing unit 208 performs various corrections and compressions as necessary and outputs the processed image data. The imaging device 201 may include an AD conversion unit that generates a digital signal to be processed by the signal processing unit 208. The AD conversion unit may be formed on a semiconductor layer (semiconductor substrate) in which the photoelectric conversion section of the imaging device 201 is formed, or may be formed in a semiconductor layer different from the semiconductor layer on which the photoelectric conversion unit of the imaging device 201 is formed. The signal processing unit 208 may be formed on the same semiconductor layer as the imaging device 201.

The imaging system 200 further includes a memory unit 210 for temporarily storing image data, and an external interface unit (external I/F unit) 212 for communicating with an external computer or the like. Further, the imaging system 200 includes a storage medium 214 such as a semiconductor memory for storing or reading out the imaging data, and a storage medium control interface unit (storage medium control I/F unit) 216 for storing or reading out the imaging data on or from the storage medium 214. The storage medium 214 may be built in the imaging system 200, or may be detachable.

The imaging system 200 further includes a general control/operation unit 218 that controls various calculations and operations of the entire digital still camera, and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

The imaging device 201 outputs the imaging signal to the signal processing unit 208. The signal processing unit 208 performs predetermined signal processing on the imaging signal output from the imaging device 201, and outputs image data. The signal processing unit 208 generates an image using the imaging signal.

As described above, according to the present embodiment, it is possible to realize an imaging system to which the photoelectric conversion device 100 according to the first or second embodiment is applied.

Fourth Embodiment

Figure 9A:
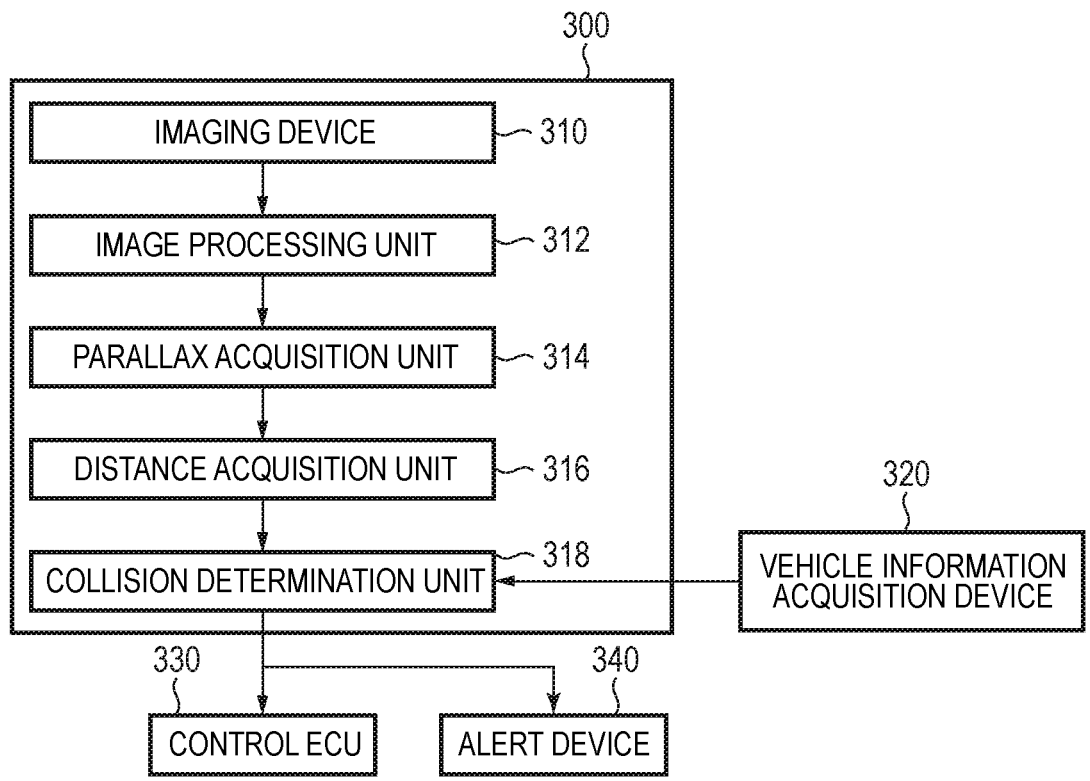
FIG. 9A is a diagram illustrating a configuration example of an imaging system according to a fourth embodiment of the disclosure.
Figure 9B:
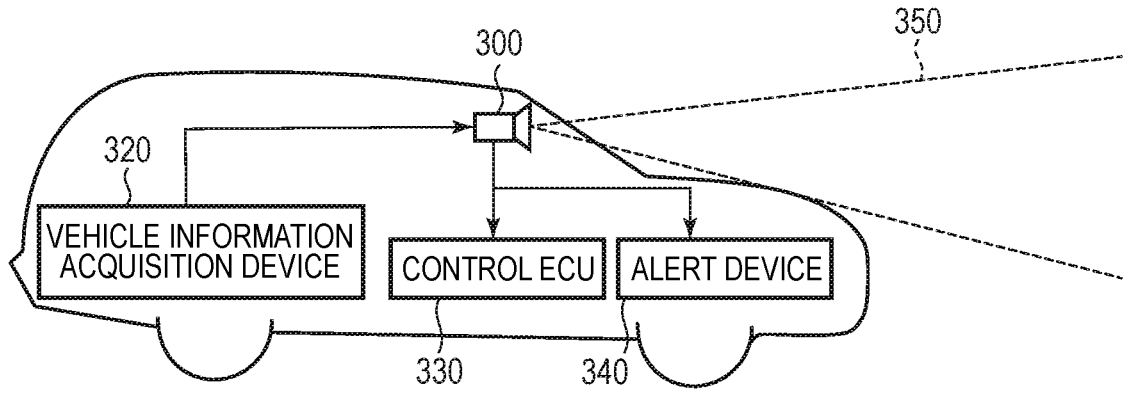
FIG. 9B is a diagram illustrating a configuration example of a movable object according to the fourth embodiment of the disclosure.

An imaging system and a movable object according to a fourth embodiment of the disclosure will be described with reference to FIG. 9A and FIG. 9B. FIG. 9A is a diagram illustrating a configuration of an imaging system according to the present embodiment. FIG. 9B is a diagram illustrating a configuration of a movable object according to the present embodiment.

FIG. 9A illustrates an example of an imaging system relating to an on-vehicle camera. The imaging system 300 includes an imaging device 310. The imaging device 310 is the photoelectric conversion device 100 described in the first or second embodiment. The imaging system 300 includes an image processing unit 312 that performs image processing on a plurality of image data acquired by the imaging device 310, and a parallax acquisition unit 314 that calculates parallax (phase difference of parallax images) from the plurality of image data acquired by the imaging system 300. The imaging system 300 includes a distance acquisition unit 316 that calculates a distance to an object based on the calculated parallax, and a collision determination unit 318 that determines whether or not there is a possibility of collision based on the calculated distance. Here, the parallax acquisition unit 314 and the distance acquisition unit 316 are examples of a distance information acquisition unit that acquires distance information to the object. That is, the distance information may be information on a parallax, a defocus amount, a distance to the object, and the like. The collision determination unit 318 may determine the collision possibility using any of these pieces of distance information. The distance information acquisition unit may be implemented by dedicated hardware or software modules. Further, it may be implemented by FPGA (Field Programmable Gate Array), ASIC (Application Specific Integrated circuit), or the like, or may be implemented by a combination of these.

The imaging system 300 is connected to a vehicle information acquisition device 320, and may acquire vehicle information such as a vehicle speed, a yaw rate, and a steering angle. Further, the imaging system 300 is connected to a control ECU 330 which is a control device that outputs a control signal for generating a braking force to the vehicle based on the determination result of the collision determination unit 318. The imaging system 300 is also connected to an alarm device 340 that issues an alert to the driver based on the determination result of the collision determination unit 318. For example, when the collision possibility is high as the determination result of the collision determination unit 318, the control ECU 330 performs vehicle control to avoid collision and reduce damage by braking, returning an accelerator, suppressing engine output, or the like. The alarm device 340 alerts a user by sounding an alarm such as a sound, displaying alert information on a screen of a car navigation system or the like, or giving vibration to a seat belt or a steering wheel.

In the present embodiment, the imaging system 300 images the periphery of the vehicle, for example, the front or the rear. FIG. 9B illustrates an imaging system in the case of imaging an image in front of a vehicle (an imaging range 350). The vehicle information acquisition device 320 sends an instruction to the imaging system 300 or the imaging device 310. With such a configuration, the accuracy of distance measurement may be further improved.

In the above description, an example has been described in which control is performed so as not to collide with other vehicles, but the disclosure is also applicable to control of automatic driving following other vehicles, control of automatic driving so as not to go out of a lane, and the like. Further, the imaging system is not limited to a vehicle such as a host vehicle, and may be applied to, for example, a movable object (moving device) such as a ship, an aircraft, or an industrial robot. In addition, the disclosure may be applied not only to a movable object but also to a wide variety of equipment such as ITS (Intelligent Transport Systems).

Fifth Embodiment

Figure 10:
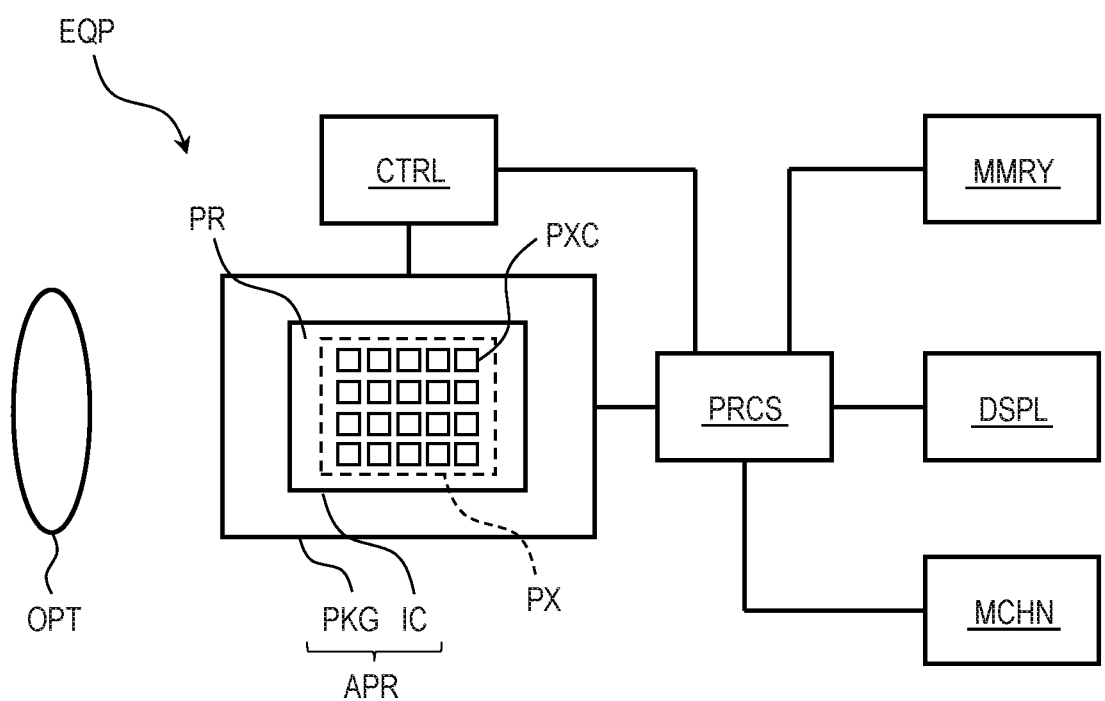
FIG. 10 is a block diagram illustrating a schematic configuration of equipment according to a fifth embodiment of the disclosure.

Equipment according to a fifth embodiment of the disclosure will be described with reference to FIG. 10. FIG. 10 is a block diagram illustrating a schematic configuration of equipment according to the present embodiment.

FIG. 10 is a schematic diagram illustrating equipment EQP including the photoelectric conversion device APR. The photoelectric conversion device APR has the function of the photoelectric conversion device 100 according to the first or second embodiment. All or a part of the photoelectric conversion device APR is a semiconductor device IC. The photoelectric conversion device APR of this example may be used, for example, as an image sensor, an AF (Auto Focus) sensor, a photometry sensor, or a distance measurement sensor. The semiconductor device IC includes a pixel area PX in which pixel circuits PXC including photoelectric conversion units are arranged in a matrix. The semiconductor device IC may include a peripheral area PR around the pixel area PX. Circuits other than the pixel circuits may be arranged in the peripheral area PR.

The photoelectric conversion device APR may have a structure (chip stacked structure) in which a first semiconductor chip provided with a plurality of photoelectric conversion units and a second semiconductor chip provided with peripheral circuits are stacked. Each peripheral circuit in the second semiconductor chip may be a column circuit corresponding to a pixel column of the first semiconductor chip. The peripheral circuits in the second semiconductor chip may be matrix circuits corresponding to the pixels or the pixel blocks of the first semiconductor chip. As a connection between the first semiconductor chip and the second semiconductor chip, a through electrode (TSV (Through Silicon Via)), an inter-chip interconnection by direct bonding of a conductor such as copper, a connection by micro bumps between chips, a connection by wire bonding, or the like may be adopted.

In addition to the semiconductor device IC, the photoelectric conversion device APR may include a package PKG that accommodates the semiconductor device IC. The package PKG may include a base body to which the semiconductor device IC is fixed, a lid body made of glass or the like facing the semiconductor device IC, and a connection member such as a bonding wire or a bump that connects a terminal provided on the base body to a terminal provided on the semiconductor device IC.

The equipment EQP may further comprise at least one of an optical device OPT, a control device CTRL, a processing device PRCS, a display device DSPL, a storage device MMRY, and a mechanical device MCHN. The optical device OPT corresponds to the photoelectric conversion device APR as a photoelectric conversion device, and is, for example, a lens, a shutter, or a mirror. The control device CTRL controls the photoelectric conversion device APR, and is, for example, a semiconductor device such as an ASIC. The processing device PRCS processes a signal output from the photoelectric conversion device APR, and constitutes an AFE (analog front end) or a DFE (digital front end). The processing unit PRCS is a semiconductor device such as a CPU (central processing unit) or an ASIC. The display device DSPL may be an EL (electroluminescent) display device or a liquid crystal display device which displays information (image) obtained by the photoelectric conversion device APR. The storage device MMRY may be a magnetic device or a semiconductor device that stores information (image) obtained by the photoelectric conversion device APR. The storage device MMRY may be a volatile memory such as an SRAM or a DRAM, or a nonvolatile memory such as a flash memory or a hard disk drive. The mechanical device MCHN includes a movable portion or a propulsion portion such as a motor or an engine. In the equipment EQP, a signal output from the photoelectric conversion device APR may be displayed on the display device DSPL, and is transmitted to the outside by a communication device (not illustrated) included in the equipment EQP. Therefore, in one embodiment, the equipment EQP further includes a storage device MMRY and a processing device PRCS separately from the storage circuit unit and the arithmetic circuit unit included in the photoelectric conversion device APR.

The equipment EQP illustrated in FIG. 10 may be an electronic device such as an information terminal (for example, a smartphone or a wearable terminal) having a photographing function or a camera (for example, an interchangeable lens camera, a compact camera, a video camera, and a surveillance camera). The mechanical device MCHN in the camera may drive components of the optical device OPT for zooming, focusing, and shutter operation. The equipment EQP may be a transportation device (movable object) such as a vehicle, a ship, or an airplane. The equipment EQP may be a medical device such as an endoscope or a CT scanner.

The mechanical device MCHN in the transport device may be used as a mobile device. The equipment EQP as a transport device is suitable for transporting the photoelectric conversion device APR, or for assisting and/or automating operation (manipulation) by an imaging function. The processing device PRCS for assisting and/or automating operation (manipulation) may perform processing for operating the mechanical device MCHN as a mobile device based on information obtained by the photoelectric conversion device APR.

The photoelectric conversion device APR according to the present embodiment may provide the designer, the manufacturer, the seller, the purchaser, and/or the user with high value. Therefore, when the photoelectric conversion device APR is mounted on the equipment EQP, the value of the equipment EQP may be increased. Therefore, in order to increase the value of the equipment EQP, it is beneficial to determine the mounting of the photoelectric conversion device APR of the present embodiment on the equipment EQP when the equipment EQP is manufactured and sold.

Modified Embodiments

The disclosure is not limited to the above-described embodiments, and various modifications are possible.

For example, an example in which some of the configurations of any of the embodiments are added to other embodiments or an example in which some of the configurations of any of the embodiments are substituted with some of the configurations of the other embodiments is also an embodiment of the disclosure.

The circuit configuration of the pixel 12 illustrated in FIG. 2 is an example, and may be changed as appropriate. For example, the number of photoelectric conversion elements included in each pixel 12 is not necessarily two as long as it may detect a phase difference in at least one direction, and may be three or more. The plurality of photoelectric conversion elements constituting one pixel 12 may be configured such that at least two pairs of photoelectric conversion elements receive light passing through different pupil regions of the incident optical system. In this case, the first signal corresponding to an amount of charge generated by the first number of photoelectric conversion elements among the plurality of photoelectric conversion elements may correspond to the A-signal. The second signal corresponding to an amount of charge generated by the photoelectric conversion elements of the second number larger than the first number among the plurality of photoelectric conversion elements may correspond to the above-described (A+B)-signal.

The pixel 12 does not necessarily have to include the select transistor M4. The capacitance value of the node FD may be switchable.

The imaging systems illustrated in the third and fourth embodiments are examples of imaging systems to which the photoelectric conversion device of the disclosure may be applied, and imaging systems to which the photoelectric conversion device of the disclosure may be applied are not limited to the configurations illustrated in FIG. 8 and FIG. 9A.

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-028880, filed Feb. 28, 2022, which is hereby incorporated by reference herein in its entirety.

What is claimed is:

1. A photoelectric conversion device comprising:
a pixel array unit in which a plurality of pixels each including a plurality of photoelectric conversion elements are arranged to form a plurality of rows and a plurality of columns; and
a control circuit configured to control the plurality of pixels on a row-by-row basis,
wherein each of the plurality of pixels is configured to be capable of outputting a first signal according to an amount of charge generated by a first number of photoelectric conversion elements among the plurality of photoelectric conversion elements and a second signal according to an amount of charge generated by a second number of photoelectric conversion elements among the plurality of photoelectric conversion elements which is greater than the first number,
wherein the control circuit is configured to
perform a first reset operation of resetting the plurality of photoelectric conversion elements and a first readout operation of reading out the second signal on pixels arranged in a first row among the plurality of rows, and
perform a second reset operation of resetting the plurality of photoelectric conversion elements, a second readout operation of reading out the first signal, and a third readout operation for reading out the second signal on pixels arranged in a second row among the plurality of rows,
wherein each of the first reset operation, the first readout operation, the second reset operation, the second readout operation, and the third readout operation is performed during one of a plurality of consecutive periods of the same length, and
wherein the control circuit is configured to perform a third reset operation of resetting the plurality of photoelectric conversion elements on pixels in any one row of the plurality of rows in a period one before a period during which the second reset operation is performed among the plurality of periods.

2. The photoelectric conversion device according to claim 1,
wherein the pixel array unit includes a first region including the first row and a second region including the second row each of which is defined by rows,
wherein the control circuit is configured to perform a reset scan that sequentially performs a reset operation on the plurality of pixels on a row-by-row basis, and a readout scan that sequentially performs a readout operation on a row-by-row basis,
wherein the control circuit is configured to
perform the first reset operation and the first readout operation on the pixels arranged in rows of the first region,
perform the second reset operation, the second readout operation, and the third readout operation on the pixels arranged in rows of the second region, and
perform the third reset operation on the pixels of any one of the plurality of rows in a period one before a period in which the second reset operation is performed.

3. The photoelectric conversion device according to claim 2, wherein the number of signals readout from the pixels arranged in the row of the first region is smaller than the number of signals readout from the pixels arranged in the row of the second region.

4. The photoelectric conversion device according to claim 1, wherein, during a period in which the third reset operation is performed on the pixels in the one row, the first readout operation or the third readout operation is performed on pixels in another row.

5. The photoelectric conversion device according to claim 1,
wherein the second row is a row in which a reset operation is performed next to a reset operation of the first row and a readout operation is performed next to a readout operation of the first row,
wherein the third reset operation is performed in a second period next to a first period during which the first reset operation of the first row is performed,
wherein the second reset operation of the second row is performed in a third period next to the second period,
wherein the first readout operation of the first row is performed in a fourth period after the third period,
wherein the second readout operation of the second row is performed in a fifth period next to the fourth period, and
wherein the third readout operation of the second row is performed in a sixth period next to the fifth period.

6. The photoelectric conversion device according to claim 1, wherein the row in which the third reset operation is performed is the same as the row in which the second reset operation is performed.

7. The photoelectric conversion device according to claim 1, wherein the row in which the third reset operation is performed is a row in which the first readout operation, the second readout operation, and the third readout operation are not performed.

8. A photoelectric conversion device comprising:
a pixel array unit in which a plurality of pixels each including a plurality of photoelectric conversion elements are arranged to form a plurality of rows and a plurality of columns; and
a control circuit configured to control the plurality of pixels on a row-by-row basis,
wherein each of the plurality of pixels is configured to be capable of outputting a first signal according to an amount of charge generated by a first number of photoelectric conversion elements among the plurality of photoelectric conversion elements and a second signal according to an amount of charge generated by a second number of photoelectric conversion elements among the plurality of photoelectric conversion elements which is greater than the first number,
wherein the pixel array unit includes a first region and a second region each defined by rows,
wherein the control circuit is configured to
perform a first reset operation of resetting the plurality of photoelectric conversion elements and a first readout operation of reading out the second signal on pixels arranged in the rows of the first region, and
perform a second reset operation of resetting the plurality of photoelectric conversion elements, a second readout operation of reading out the first signal, and a third readout operation of reading out the second signal on pixels arranged in the rows of the second region,
wherein each of the first reset operation, the first readout operation, the second reset operation, the second readout operation, and the third readout operation is performed during one of a plurality of consecutive periods of the same length, and
wherein the control circuit is configured to perform a third reset operation of resetting the plurality of photoelectric conversion elements on pixels in another row during a period in which the first readout operation or the third readout operation is performed in each of the plurality of rows.

9. The photoelectric conversion device according to claim 8, wherein the number of signals readout from the pixels arranged in the rows of the first region is smaller than the number of signals readout from the pixels arranged in the rows of the second region.

10. The photoelectric conversion device according to claim 1,
wherein each of the plurality of pixels includes a first photoelectric conversion element and a second photoelectric conversion element,
wherein the first signal is a signal corresponding to an amount of charge generated by the first photoelectric conversion element, and
wherein the second signal is a signal corresponding to an amount of charge generated by the first photoelectric conversion element and the second photoelectric conversion element.

11. The photoelectric conversion device according to claim 1, wherein each of the plurality of pixels includes one microlens provided corresponding to the plurality of photoelectric conversion elements.

12. The photoelectric conversion device according to claim 1,
wherein the first signal is a signal for focus detection, and
wherein the second signal is a signal for image generation.

13. The photoelectric conversion device according to claim 1, wherein the number of photoelectric conversion elements reset in the first reset operation, the number of photoelectric conversion elements reset in the second reset operation, and the number of photoelectric conversion elements reset in the third reset operation are the same.

14. A method of driving a photoelectric conversion element including a pixel array unit in which a plurality of pixels each including a plurality of photoelectric conversion elements are arranged to form a plurality of rows and a plurality of columns, each of the plurality of pixels being configured to be capable of outputting a first signal according to an amount of charge generated by a first number of photoelectric conversion elements among the plurality of photoelectric conversion elements and a second signal according to an amount of charge generated by a second number of photoelectric conversion elements among the plurality of photoelectric conversion elements which is greater than the first number, and the pixel array unit including a first region including a first region and a second region each defined by rows, the method comprising:
performing a first reset operation of resetting the plurality of photoelectric conversion elements and a first readout operation of reading out the second signal on pixels arranged in the rows of the first region, and
performing a second reset operation of resetting the plurality of photoelectric conversion elements, a second readout operation of reading out the first signal, and a third readout operation of reading out the second signal are performed on pixels arranged in the rows of the second region, wherein each of the first reset operation, the first readout operation, the second reset operation, the second readout operation, and the third readout operation is performed during one of a plurality of consecutive periods of the same length, and wherein the method further comprises performing a third reset operation of resetting the plurality of photoelectric conversion elements on pixels in another row during a period in which the first readout operation or the third readout operation is performed on pixels in each of the plurality of rows.

15. The method according to claim 14, wherein, during a period in which the third reset operation is performed on the pixels in the one row, the first readout operation or the third readout operation is performed on pixels in another row.

16. The method according to claim 14,
wherein the second row is a row in which a reset operation is performed next to a reset operation of the first row and a readout operation is performed next to a readout operation of the first row,
wherein the third reset operation is performed in a second period next to a first period during which the first reset operation of the first row is performed,
wherein the second reset operation of the second row is performed in a third period next to the second period,
wherein the first readout operation of the first row is performed in a fourth period after the third period,
wherein the second readout operation of the second row is performed in a fifth period next to the fourth period, and
wherein the third readout operation of the second row is performed in a sixth period next to the fifth period.

17. The method according to claim 14, wherein the row in which the third reset operation is performed is the same as the row in which the second reset operation is performed.

18. A system comprising:
the conversion device according to claim 1; and
a signal processing device configured to process a signal output from the conversion device.

19. A movable object comprising:
the conversion device according to claim 1;
a distance information acquisition unit configured to acquire distance information to an object from a parallax image based on a signal from the conversion device; and
a control unit configured to control the movable object based on the distance information.

20. Equipment comprising:
the photoelectric conversion device according to claim 1, and
at least one of
an optical device corresponding to the photoelectric conversion device,
a control device configured to control the photoelectric conversion device,
a processing device configured to process a signal output from the photoelectric conversion device,
a mechanical device that is controlled based on information obtained by the photoelectric conversion device,
a display device configured to display information obtained by the photoelectric conversion device, and
a storage device configured to store information obtained by the photoelectric conversion device.

* * * * *